(12) United States Patent
Churchwell et al.

(10) Patent No.: US 9,024,406 B2
(45) Date of Patent: May 5, 2015

(54) IMAGING SYSTEMS WITH CIRCUIT ELEMENT IN CARRIER WAFER

(71) Applicant: Semiconductor Components Industries, LLC, Phoenix, AZ (US)

(72) Inventors: Scott Churchwell, Meridian, ID (US); Marc Sulfridge, Boise, ID (US); Swarnal Borthakur, Boise, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/035,863

(22) Filed: Sep. 24, 2013

(65) Prior Publication Data

US 2014/0084407 A1  Mar. 27, 2014

Related U.S. Application Data

(60) Provisional application No. 61/705,590, filed on Sep. 25, 2012.

(51) Int. Cl.
H01L 27/146 (2006.01)
(52) U.S. Cl.
CPC ...... *H01L 27/14634* (2013.01); *H01L 27/1469* (2013.01); *H01L 27/14609* (2013.01); *H01L 27/14621* (2013.01); *H01L 27/14625* (2013.01); *H01L 27/14685* (2013.01)

(58) Field of Classification Search
CPC ............. H01L 27/14634; H01L 27/1469; H01L 27/14621; H01L 27/14685
USPC ................................. 257/443, 678; 438/106
See application file for complete search history.

(56) References Cited

U.S. PATENT DOCUMENTS

| | | | |
|---|---|---|---|
| 7,910,965 B2 * | 3/2011 | Lee et al. | 257/292 |
| 8,274,101 B2 | 9/2012 | Venezia et al. | |
| 8,629,524 B2 | 1/2014 | Wang et al. | |
| 8,809,984 B2 * | 8/2014 | Jan | 257/432 |
| 2010/0013039 A1 * | 1/2010 | Qian et al. | 257/432 |
| 2012/0061789 A1 | 3/2012 | Yang et al. | |
| 2013/0334638 A1 * | 12/2013 | Chen et al. | 257/432 |

* cited by examiner

*Primary Examiner* — William D Coleman
(74) *Attorney, Agent, or Firm* — Treyz Law Group; Kendall P. Woodruff

(57) ABSTRACT

An imaging system may include an image sensor package with an image sensor wafer mounted on a carrier wafer, which may be a silicon substrate. A capacitor may be formed in the carrier wafer. Trenches may be etched in a serpentine pattern in the silicon substrate. Conductive plates of the capacitor may be formed at least partially in the trenches. An insulator material may be formed between the capacitor and the silicon substrate. A dielectric layer may be formed between the conductive plates of the capacitor. The image sensor package may be mounted on a printed circuit board via a ball grid array. Conductive vias may electrically couple the capacitor and the image sensor wafer to the printed circuit board.

20 Claims, 5 Drawing Sheets

IMAGING SYSTEMS WITH CIRCUIT ELEMENT IN CARRIER WAFER

This application claims the benefit of provisional patent application No. 61/705,590, filed Sep. 25, 2012, which is hereby incorporated by reference herein in its entirety.

BACKGROUND

This relates generally to imaging systems, and more particularly, to imaging systems with circuit components in carrier wafers.

Modern electronic devices such as cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals. An image sensor contains an image sensor wafer containing an array of photodiodes. The image sensor wafer may be a back side illuminated (BSI) image sensor wafer that is mounted on a carrier wafer such as a silicon substrate, forming an image sensor stack. The image sensor stack is then mounted on a printed circuit substrate in an electronic device.

In conventional imaging systems, the printed circuit board on which a carrier wafer is mounted may contain circuitry (e.g., circuitry for operating the imager or other suitable circuitry). However, the amount of space on a printed circuit substrate for forming circuitry near an image sensor package may be limited. Accommodating circuit elements such as capacitors can limit the amount of space available on the printed circuit substrate for other circuitry.

It would therefore be desirable to provide improved ways of accommodating circuit elements in imaging systems.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
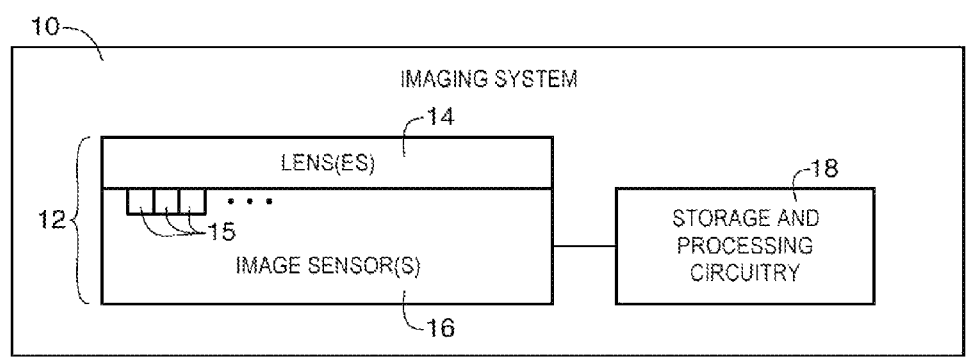
FIG. 1 is a diagram of an illustrative imaging system that may include a camera module having an image sensor in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18. Image sensor 16 may, for example, be a backside illumination image sensor. If desired, camera module 12 may be provided with an array of lenses 14 and an array of corresponding image sensors 16. Image sensor 16 may include an array of image sensor pixels such as an array of image sensor pixels 15 and a corresponding array of color filter elements.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
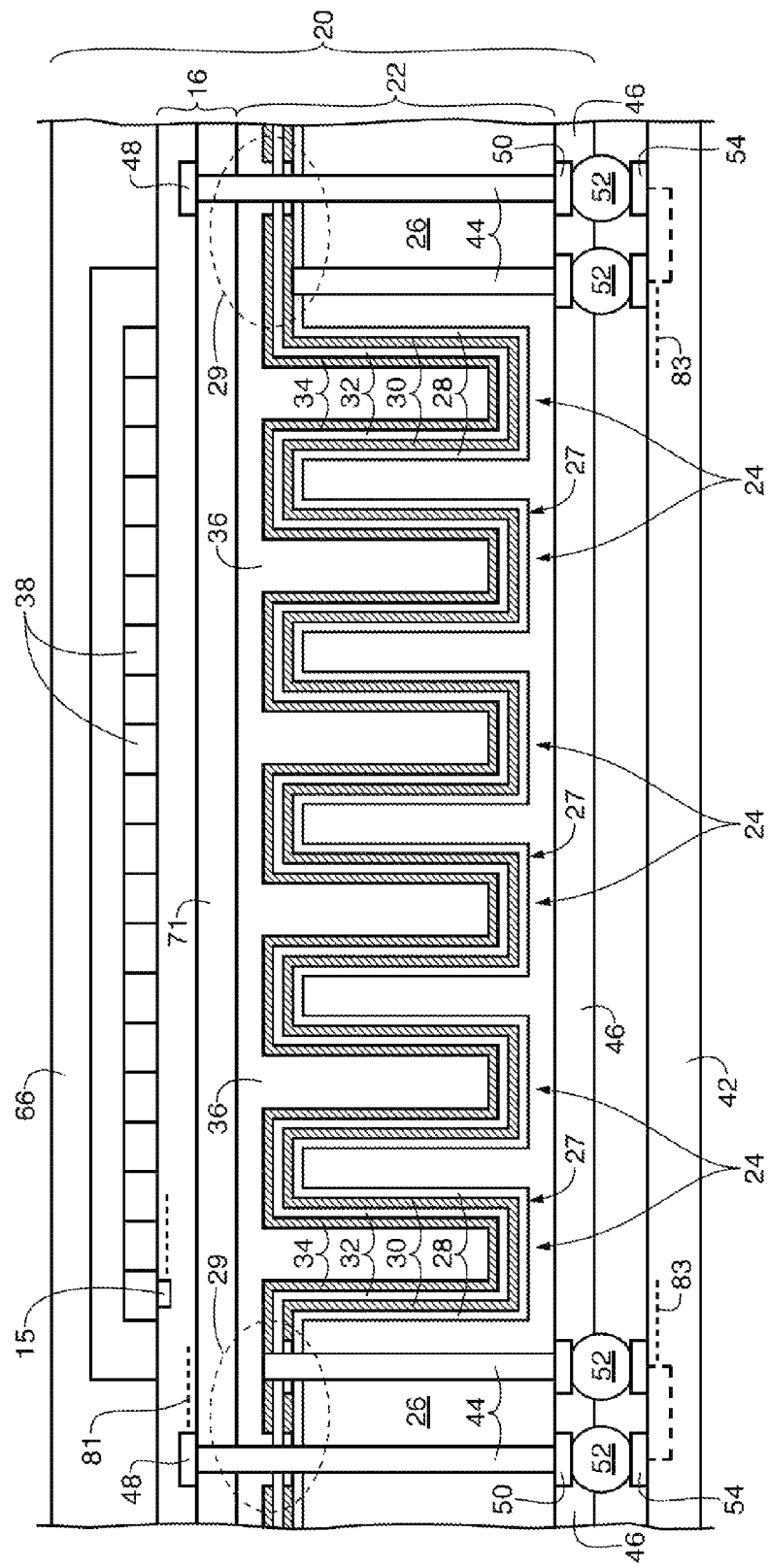
FIG. 2 is a cross-sectional side view of an image sensor package having a carrier wafer with circuit elements in accordance with an embodiment of the present invention.

FIG. 2 is a cross-sectional side view of an image sensor package (also known as a chip-scale package) such as image sensor package 20 that is mounted to a printed circuit substrate such as printed circuit board (PCB) 42. Image sensor package 20 may include a wafer with photosensitive elements such as image sensor 16 (also sometimes referred to as image sensor wafer 16) and a carrier wafer such as carrier wafer 22. Image sensor package 20 may also optionally include a cover glass such as cover glass 66 and a passivation layer such as passivation layer 46. Image sensor wafer 16 may be mounted on carrier wafer 22. Image sensor package 20 may be a backside illuminated (BSI) imaging system having an array of BSI imaging pixels 15 on image sensor wafer 16. Carrier wafer 22 may include one or more circuit elements such as circuit element 24. In the illustrative example of FIG. 2, circuit element 24 is a capacitor. This is, however, merely illustrative. If desired, circuit element 24 may include other suitable types of passive circuitry (e.g., other suitable types of non-powered circuitry) such as resistors and inductors. Arrangements in which circuit element 24 in carrier wafer 22 is a capacitor are described herein as an example.

Capacitor 24 may be a parallel plate capacitor having a first conductive plate and a second conductive plate such as top and bottom cell plates 30 and 34 respectively. Forming capacitor 24 may include forming top and bottom cell plates 30 and 34 such that a dielectric layer such as dielectric layer 32 is interposed between the conductive plates (e.g. between top cell plate 30 and bottom cell plate 34). Forming capacitor 24 in carrier wafer 22 may also include having an insulator material such as insulator material 28 surrounding the outer surfaces of the conductive plates.

Carrier wafer 22 may be formed from a silicon substrate such as silicon substrate 26. Forming capacitor 24 in carrier wafer 22 may include forming a trench such as trench 27 in the top surface of silicon substrate 26 using etching equipment. Trench 27 may be formed in a serpentine pattern in carrier wafer 22 (see, e.g., FIG. 3 and corresponding description). Multiple layers of materials (for example, conductive materials to form capacitor 24) and insulator materials may be deposited in trench 27.

Insulator material 28 may be deposited in a region of carrier wafer 22 that does not include trench 27, such as circled regions 29. Insulator material 28 may also be deposited as a coating in trench 27. Insulator 28 may be interposed between top and bottom cell plates 30 and 34.

Bottom cell plate 30 may be formed by depositing metal material as a coating over insulator material 28 in circled regions 29 and in trench 27. Alternatively, bottom cell plate 30 may be formed as an integrated portion of image sensor 16 by doping portions of silicon in image sensor 16.

Dielectric layer 32 may be formed as a coating over bottom cell plate 30 in trench 27 and in circled regions 29. Dielectric layer 32 may be formed from a dielectric material with a dielectric constant greater than the dielectric constant of silicon dioxide (also known as a "high-k" material). Dielectric layer 32 may be interposed between top cell plate 34 and bottom cell plate 30.

Top cell plate 34 may be formed by depositing metal material as a coating over dielectric layer 32 in circled regions 29 and in trench 27.

An oxide layer such as oxide layer 36 may be deposited over top cell plate 34 in circled regions 29 and in trench 27 such that the top surface of oxide layer 36 forms a top surface of carrier wafer 22. Image sensor wafer 16 may have an oxide layer such as oxide layer 71. Carrier wafer 22 may be bonded to image sensor wafer 16 by bonding the top surface of oxide layer 36 of carrier wafer 22 to a bottom surface of oxide layer 71 through an oxide bonding process.

Color filter array 38 may be formed over pixels 15 on image sensor wafer 16. A glass component (also sometimes referred to as a cover glass) such as cover glass 66 may be formed over color filter array 38 to protect image sensor wafer 16 from dust and other possible sources of contamination. A lens such as lens 14 shown in FIG. 1 may be formed over cover glass 66 and may focus light through color filter array 38 onto photosensitive elements such as image sensor pixels 15 of image sensor wafer 16.

Carrier wafer 22 may be mounted to PCB 42. Top cell plate 34 and bottom cell plate 30 of capacitor 24 may be electrically coupled to image sensor wafer 16 and PCB 42 using conductive through-silicon vias (TSV) such as vias 44. Vias 44 may pass from a top side of carrier wafer 22 through carrier wafer 22 to an opposing bottom side of carrier wafer 22. Vias 44 may pass through silicon material 26, insulator material 28, bottom cell plate metal 30, dielectric material 32, top cell plate material 34 and oxide layer 36 of circled region 29 of carrier wafer 22. Vias 44 may be used to electrically couple circuitry 83 on PCB 42 to image sensor circuitry in image sensor wafer 16 such as traces 81. Portions of top cell plate 34 and bottom cell plate 30 may be removed using photolithography or other suitable etching process to allow vias 44 to pass through capacitor 24 of carrier wafer 22. Removal of the metal material of the top and bottom cell plates may be performed after the formation of each cell plate or during TSV processing. TSV processing may occur after or before cover glass 66 is mounted on image sensor array substrate.

Passivation layer 46 may have conductive ball pads such as ball pads 50. Vias 44 may form an electrical contact between bond pads in image sensor wafer 16 such as bond pads 48 and ball pads 50. Vias 44 may also electrically couple capacitor 24 to ball pads 50 (e.g. top cell plate 34 and/or bottom cell plate 30 may be electrically coupled to ball pads 50).

Ball pads 50 may be electrically coupled to circuitry on PCB 42 using solder balls such as solder balls 52 (e.g., solder balls that form part of a ball grid array). Solder balls 52 may be initially formed on ball pads 50 before solder balls 52 form a contact with contact pads on PCB 42 such as contact pads 54 (i.e. before carrier wafer 22 is bonded to PCB 42). Solder balls 52 may provide electrical contacts between PCB 42 and vias 44. This is, however, merely illustrative. Image sensor package 20 may be mounted to PCB 42 using any other suitable surface-mount technology or interconnection techniques such as wire bonding techniques.

Figure 3:
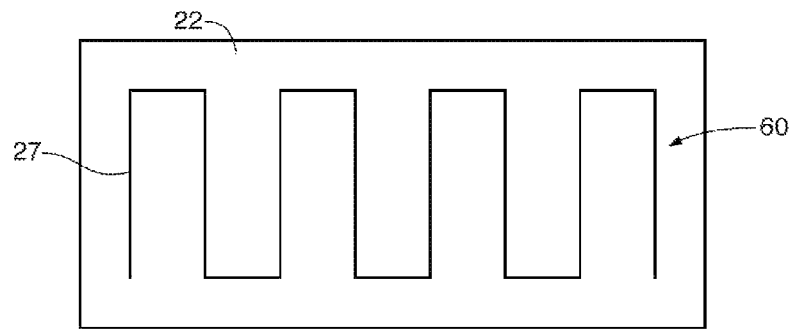
FIG. 3 is a top view of an illustrative carrier wafer having circuit components in accordance with an embodiment of the present invention.

FIG. 3 is a top view of an illustrative carrier wafer such as carrier wafer 22 with circuit components such as capacitor 24 formed in the carrier wafer. Capacitor 24 may be formed in a pattern such as serpentine pattern 60 in carrier wafer 22 (i.e., trench 27 may be etched in a serpentine pattern in carrier wafer 22). Forming the conductive plates of capacitor 24 in a serpentine pattern may maximize the surface area of the conductive plates, thereby maximizing the capacitance of capacitor 24 without requiring a large amount of space in carrier wafer 22. This pattern is merely illustrative; capacitor 24 may be formed in any suitable pattern in carrier wafer 22.

Figure 4:
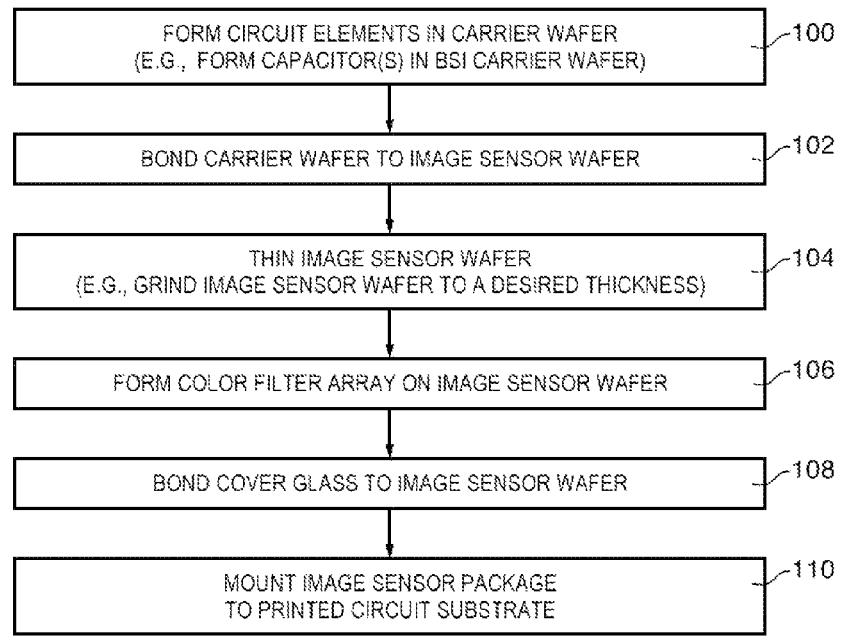
FIG. 4 is a flow chart showing illustrative steps that may be involved in forming an illustrative imaging system having a carrier wafer with circuit components in accordance with an embodiment of the present invention.

FIG. 4 is a flow chart showing illustrative steps that may be involved in forming an illustrative imaging system having a carrier wafer with circuit components. At step 100, circuit components such as capacitor 24 may be formed in a carrier wafer such as carrier wafer 22. For example, as shown in FIG. 2, a capacitor may be formed in a BSI carrier wafer.

At step 102, the carrier wafer may be bonded to an image sensor wafer. For example, carrier wafer 22 may be bonded to image sensor wafer 16. An oxide layer such as oxide layer 36 that forms the top surface of carrier wafer 22 may be bonded to an oxide layer (e.g. oxide layer 71) of the image sensor array wafer using oxide bonding techniques.

At step 104, the image sensor wafer (such as image sensor 16) may be thinned. For example, image sensor 16 may be grinded using suitable grinding equipment until image sensor 16 has a desired thickness.

At step 106, a color filter array such as color filter array 38 may be formed over pixels such as pixels 15 on image sensor wafer 16.

At step 108, a cover glass such as cover glass 66 may be bonded to the image sensor wafer.

At step 110, the image sensor package including the image sensor wafer, carrier wafer, and the cover glass such as image sensor package 20 as shown in FIG. 2 may be mounted on a printed circuit substrate (such as PCB 42).

Figure 5:
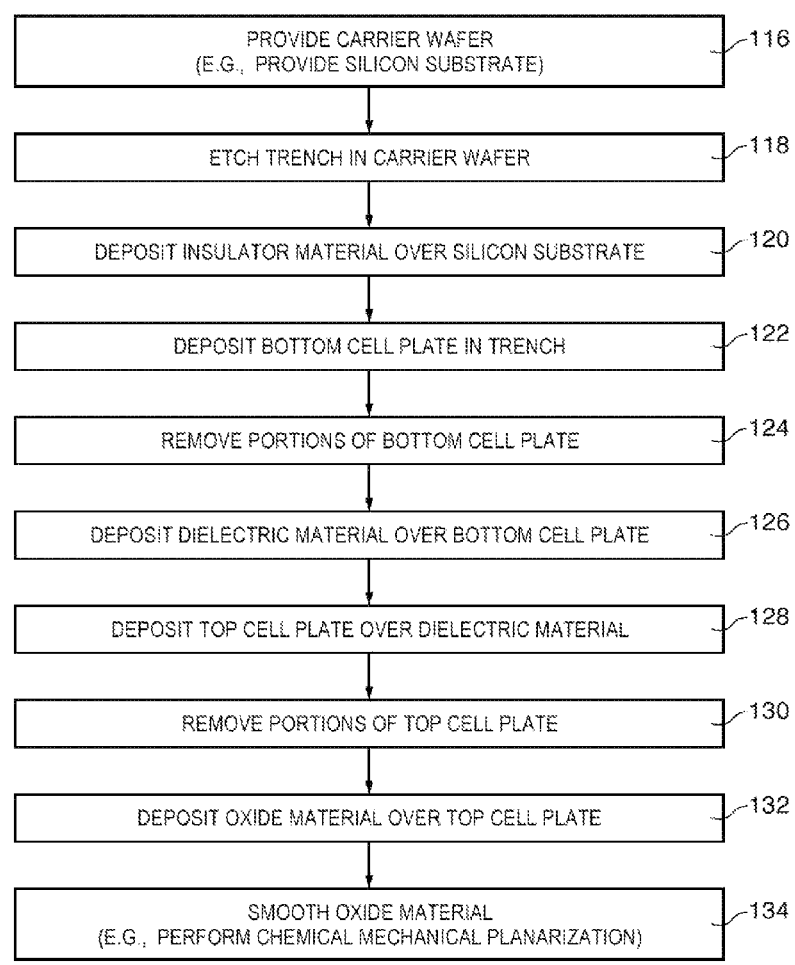
FIG. 5 is a flow chart showing illustrative steps that may be involved in forming an illustrative carrier wafer with circuit components in accordance with an embodiment of the present invention.

FIG. 5 is a flow chart showing illustrative steps that may be involved in forming circuit components in a carrier wafer of an image sensor as described in step 100 of FIG. 4.

At step 116, a carrier wafer such as carrier wafer 22 may be provided. For example, a silicon substrate such as silicon substrate 26 may be provided.

At step 118, a trench such as trench 27 may be etched in the carrier wafer. Trench 27 may be etched using suitable etching equipment and may be etched in a serpentine pattern such as pattern 60 in carrier wafer 22, as shown in FIG. 3.

At step 120, insulator material such as insulator material 28 may be deposited over the silicon substrate. Insulator material 28 may be deposited over regions of the silicon substrate that have not been etched (e.g. regions that do not include trench 27) such as circled regions 29 and may also be deposited in trench 27 as shown in FIG. 2.

At step 122, a bottom cell plate such as bottom cell plate 30 may be deposited over the insulator material. For example, a metal material may be deposited as a coating over insulator material 28 in circled regions 29 and in trench 27.

Portions of bottom cell plate 30 may be removed at step 124 in order to accommodate portions of conductive through-silicon vias that may be formed after bottom cell plate 30 is formed.

At step 126, dielectric layer 32 may be deposited as a coating over bottom cell plate 30 in circled regions 29. Dielectric layer 32 may be formed from a dielectric material with a dielectric constant greater than the dielectric constant of silicon dioxide (also known as a "high-k" material).

At step 128, a top cell plate such as top cell plate 34 may be formed over the dielectric material. For example, a metal material may be deposited as a coating over dielectric layer 32 in circled regions 29 and in trench 27.

Portions of top cell plate 34 may be removed at optional step 130 in order to accommodate through-silicon vias that may be formed after top cell plate 34 is formed.

At step 132, an oxide layer such as oxide layer 36 may be deposited over the top cell plate such as top cell plate 34 in circled regions 29 of the carrier wafer and in trench 27 as shown in FIG. 2. The top surface of oxide layer 36 may form a top surface of carrier wafer 22.

At step 134, the oxide material may be smoothed. For example, chemical mechanical planarization or other suitable types of planarization methods may be performed on oxide layer 36 so that the top surface of oxide layer 36 is smooth and planar.

Figure 6:
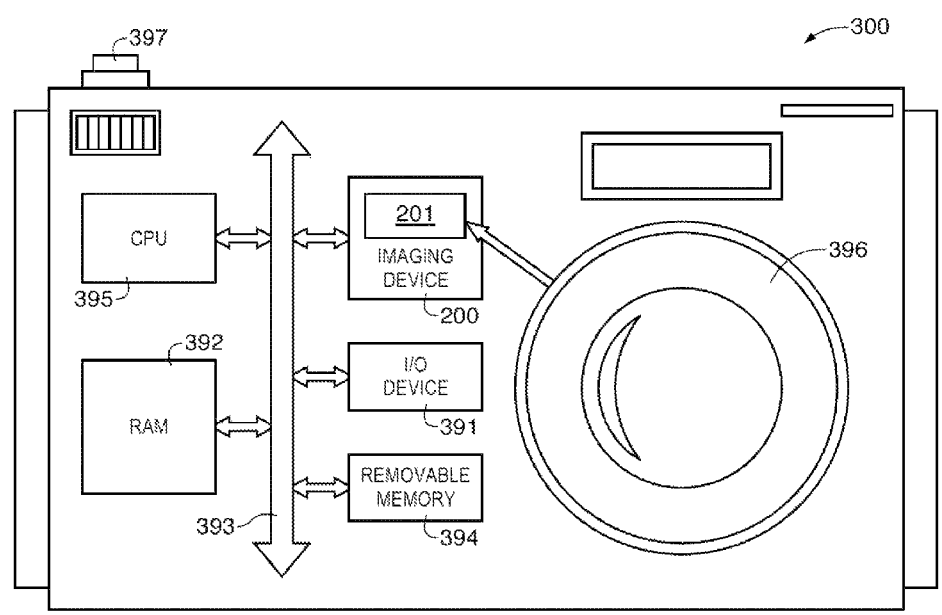
FIG. 6 is a block diagram of an system employing the embodiments of FIGS. 1-5 in accordance with an embodiment of the present invention.

FIG. 6 shows in simplified form a typical processor system 300, such as a digital camera, which includes an imaging device 200. Imaging device 200 may include a pixel array 201. Imaging device 200 may include an image sensor package such as image sensor package 20 mounted on a printed circuit substrate such as PCB 42 as shown in FIG. 2. Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems having carrier wafers with circuit components. An image sensor package may have an image sensor wafer having an array of image pixels that is mounted on a carrier wafer (i.e. the carrier wafer may be bonded to the image sensor wafer). A circuit component such as a capacitor may be formed in a silicon substrate of the carrier wafer. An insulator material may be interposed between the silicon substrate and the capacitor. The capacitor formed in the carrier wafer may include a bottom cell plate (i.e. a first conductive plate) formed over the silicon substrate, a top cell plate (i.e. a second conductive plate) formed over the bottom cell plate, and a dielectric layer (e.g. a high-k material) interposed between the top cell plate and the bottom cell plate.

A trench may be etched in a serpentine pattern in the surface of the silicon substrate. The bottom cell plate, the top cell plate, the insulator material, and the dielectric layer of the capacitor may be at least partially formed within the trench by depositing the materials in the trench. Portions of the first and second conductive plates may be etched. An oxide layer may be formed over the top cell plate such that the oxide layer has a top surface that forms a top surface of the carrier wafer. The image sensor wafer may be thinned. A glass component may be bonded to the image sensor wafer.

The image sensor package including the carrier wafer may be mounted to the printed circuit substrate. A conductive via that passes from a top side of the carrier wafer through the carrier wafer to an opposing bottom side of the carrier wafer may electrically couple circuitry on the printed circuit substrate to image sensor circuitry on the image sensor wafer. First and second additional conductive vias may pass through at least a portion of the carrier wafer to couple the top and bottom cell plates, respectively, of the capacitor to circuitry on the printed circuit substrate. The carrier wafer may be mounted to the printed circuit substrate using solder.

The foregoing is merely illustrative of the principles of this invention which can be practiced in other embodiments.

What is claimed is:

1. Apparatus, comprising:
    a carrier wafer comprising a silicon substrate with a surface, wherein a trench is formed in the surface;
    an image sensor wafer having an array of image pixels, wherein the image sensor wafer is mounted on the carrier wafer; and
    a circuit element that is at least partially formed within the trench in the surface of the carrier wafer.

2. The apparatus defined in claim 1, wherein the circuit element comprises a capacitor.

3. The apparatus defined in claim 2, further comprising an insulator material interposed between the silicon substrate and the capacitor, wherein the capacitor comprises:
    a bottom cell plate formed over the silicon substrate;
    a top cell plate formed over the bottom cell plate; and
    a dielectric layer interposed between the top cell plate and the bottom cell plate.

4. The apparatus defined in claim 3, wherein the bottom cell plate, the top cell plate, the insulator material, and the dielectric layer are at least partially formed within the trench.

5. The apparatus defined in claim 3, wherein the dielectric material is a high-k material.

6. The apparatus defined in claim 3, further comprising an oxide layer formed over the top cell plate and wherein the oxide layer has a top surface that forms a top surface of the carrier wafer.

7. The apparatus defined in claim 3, further comprising a printed circuit substrate, wherein the carrier wafer is mounted to the printed circuit substrate.

8. The apparatus defined in claim 4, wherein the trench is formed in a serpentine pattern.

9. The apparatus defined in claim 7, further comprising a conductive via that passes from a top side of the carrier wafer through the carrier wafer to an opposing bottom side of the carrier wafer, wherein the conductive via electrically couples circuitry on the printed circuit substrate to image sensor circuitry on the image sensor wafer.

10. The apparatus defined in claim 9, further comprising first and second additional conductive vias that pass through at least a portion of the carrier wafer, wherein the first and the second additional conductive vias respectively couple the top and the bottom cell plates of the capacitor to circuitry on the printed circuit substrate.

11. The apparatus defined in claim 10, wherein the carrier wafer is mounted to the printed circuit substrate using solder.

12. A method of forming an image sensor package, wherein the image sensor package comprises an image sensor wafer having an array of image pixels, comprising:
    thinning the image sensor wafer;
    forming a circuit element in a carrier wafer; and
    bonding the carrier wafer to the image sensor wafer.

13. The method defined in claim 12, wherein the carrier wafer comprises a silicon substrate and wherein forming the circuit element in the carrier wafer comprises forming a capacitor in the silicon substrate.

14. The method defined in claim 12, further comprising bonding a glass layer to the image sensor wafer and mounting the image sensor package to a printed circuit substrate.

15. The method defined in claim 13, wherein forming the capacitor comprises:
    etching a trench in the silicon substrate;
    depositing an insulator material in the trench;
    forming a first conductive plate over the insulator material;
    depositing a dielectric material over the first conductive plate; and
    forming a second conductive plate over the dielectric material.

16. The method defined in claim 15, further comprising etching portions of the first conductive plate and the second conductive plate.

17. A system, comprising:
    a central processing unit;
    memory;
    input-output circuitry; and
    an imaging device, wherein the imaging device comprises:
        an image sensor wafer;
        a carrier wafer bonded to the image sensor wafer, wherein the carrier wafer comprises a silicone substrate having a trench; and
        at least one circuit element at least partly formed in the trench in the carrier wafer.

18. The system defined in claim 17, wherein the at least one circuit element comprises a capacitor.

19. The system defined in claim 17, wherein the at least one circuit element comprises an inductor.

20. The system defined in claim 17, wherein the at least one circuit element comprises a resistor.

* * * * *